United States Patent
Immel et al.

(10) Patent No.: US 10,044,180 B2
(45) Date of Patent: Aug. 7, 2018

(54) ELECTRONIC CIRCUIT BREAKER FOR AN ELECTRICAL LOAD IN AN ON-BOARD ELECTRICAL SYSTEM OF A MOTOR VEHICLE

(71) Applicant: Lisa Draexlmaier GmbH, Vilsbiburg (DE)

(72) Inventors: Alexander Immel, Ergolding (DE); Anton Bachmeier, Kumhausen (DE)

(73) Assignee: LISA DRAEXLMAIER GMBH, Vilsbiburg (DE)

( * ) Notice: Subject to any disclaimer, the term of this patent is extended or adjusted under 35 U.S.C. 154(b) by 0 days.

(21) Appl. No.: 15/671,932

(22) Filed: Aug. 8, 2017

(65) Prior Publication Data
US 2018/0048142 A1    Feb. 15, 2018

(30) Foreign Application Priority Data
Aug. 9, 2016 (DE) .......................... 10 2016 114 740

(51) Int. Cl.

| | | |
|---|---|---|
| *H01H 3/04* | (2006.01) | |
| *H02H 3/087* | (2006.01) | |
| *B60R 16/03* | (2006.01) | |
| *H03K 17/082* | (2006.01) | |
| *B60L 3/04* | (2006.01) | |

(Continued)

(52) U.S. Cl.
CPC ............... *H02H 3/087* (2013.01); *B60L 3/04* (2013.01); *B60R 16/03* (2013.01); *H01H 3/54* (2013.01); *H02J 1/08* (2013.01); *H03K 17/0822* (2013.01)

(58) Field of Classification Search
CPC .... H01H 33/16; H01H 33/596; H01H 33/161; H01H 33/22; H01H 33/32; H01H 33/34; H01H 33/38; H01H 9/54; H01H 9/542; H01H 2071/048; H01H 2201/004; H01H 33/04; H01H 33/121; H01H 2071/006
See application file for complete search history.

(56) References Cited

U.S. PATENT DOCUMENTS 4,706,908 A * 11/1987 Huffman ................ B64D 13/06
                                                       244/118.5
4,803,586 A *  2/1989 Tabor ................... H02M 5/2573
                                                        307/117

(Continued)

FOREIGN PATENT DOCUMENTS

| DE | 102011121850 | 9/2012 |
|---|---|---|
| DE | 102011057002 | 6/2013 |
| DE | 102014115588 | 4/2016 |

*Primary Examiner* — Truc Nguyen
(74) *Attorney, Agent, or Firm* — Burris Law, PLLC

(57) ABSTRACT

The present disclosure includes an electronic circuit breaker for an electrical load in and on-board electrical system of a motor vehicle. The electronic circuit breaker includes a shunt resistor connected at its input side to an input (E) of the electronic circuit breaker, a controllable switching element coupled at its input side to an output of the shunt resistor and at its output side to an output (A) of the electronic circuit breaker, the output being connectable to the electrical load, and a control input (gate). The electronic circuit breaker also includes a voltage detector and a hold element coupled to the voltage detector and configured to hold the control signal in a switched off (out) state when the controllable switching element has switched off the electrical load.

9 Claims, 2 Drawing Sheets

(51) Int. Cl.
  *H02J 1/08*   (2006.01)
  *H01H 3/54*   (2006.01)

(56) References Cited

U.S. PATENT DOCUMENTS

| | | | | |
|---|---|---|---|---|
| 4,860,157 | A * | 8/1989 | Russell | H01H 83/20 |
| | | | | 361/156 |
| 5,517,378 | A * | 5/1996 | Asplund | H01H 33/596 |
| | | | | 361/3 |
| 6,141,197 | A * | 10/2000 | Kim | H02H 1/0015 |
| | | | | 361/102 |
| 6,327,130 | B1 * | 12/2001 | Durif | H01H 47/02 |
| | | | | 361/139 |
| 6,583,997 | B1 * | 6/2003 | Reid | H02H 1/06 |
| | | | | 363/50 |
| 6,594,129 | B1 | 7/2003 | Baba et al. | |
| 2005/0135034 | A1 | 6/2005 | Johnson et al. | |
| 2008/0136567 | A1 * | 6/2008 | Chelloug | H01H 71/123 |
| | | | | 335/17 |
| 2009/0206059 | A1 * | 8/2009 | Kiko | H02J 3/14 |
| | | | | 218/143 |
| 2012/0063043 | A1 * | 3/2012 | Divan | H02H 9/001 |
| | | | | 361/58 |
| 2013/0293994 | A1 * | 11/2013 | Bellini | H01H 71/123 |
| | | | | 361/79 |
| 2014/0078622 | A1 * | 3/2014 | Crane | H02H 3/087 |
| | | | | 361/8 |
| 2014/0091061 | A1 * | 4/2014 | Henke | G01R 31/02 |
| | | | | 218/8 |
| 2015/0002977 | A1 * | 1/2015 | Dupraz | H01H 9/542 |
| | | | | 361/115 |
| 2016/0133410 | A1 * | 5/2016 | Bock | H01H 47/22 |
| | | | | 361/160 |

* cited by examiner

ELECTRONIC CIRCUIT BREAKER FOR AN ELECTRICAL LOAD IN AN ON-BOARD ELECTRICAL SYSTEM OF A MOTOR VEHICLE

CROSS-REFERENCE TO RELATED APPLICATIONS

This application claims priority to and the benefit of DE 10 2016 114 740.0 filed on Aug. 9, 2016. The disclosure of the above applications is incorporated herein by reference.

FIELD

The present disclosure relates to an electronic circuit breaker for an electrical load in an on-board electrical system of a motor vehicle.

BACKGROUND

The statements in this section merely provide background information related to the present disclosure and may not constitute prior art.

The present disclosure will be described below primarily in connection with loads in an on-board electrical system in motor vehicles. However, it is understood that the present disclosure may be implemented in any application in which electrical connections are to be protected.

Melting fuses are generally used in motor vehicles to safeguard electric lines against overloads. In particular, melting fuses are known for this in which a gap between two printed conductors is bridged with the aid of a melted metal body such as one of tin. Such a fuse arrangement is disclosed in DE 10 2014 115 588, for example.

As an alternative, electronic circuit breakers are used that are configured to be triggered when a safeguarding condition is met. The safeguarding condition may depend on the signal on the line to be protected or on another event, with the result that an overload situation or damage to a load is prevented. One example of a safeguarding condition is that the signal reaches or exceeds a predetermined threshold value (or drops below this threshold value). In this manner, an unsafe increase in current (or voltage or temperature) can be recognized and the safeguarding event triggered.

An intelligent on-board electrical system with power distributors must carry out two fundamental tasks: first, to supply and cut off the consumer via a circuit element on the high-voltage side (high side), and second, to protect the consumer from gradual overcurrents and hard short circuits. To provide protection from hard short circuits it is necessary to measure the current. Conventional methods are based on a shunt-current measurement using special integrated circuits. Many integrated modules such as LINEAR TECHNOLOGY (LT) 6108 or INA200 (i.e., a shunt monitor by TEXAS INSTRUMENTS) are available for this on the market. Unfortunately, for more accurate current measurement this method is usually associated with relatively high costs, required supply voltages and with relatively high current consumption in the ON state.

The German patent application publication DE 10 2011 121 850 A1 describes a circuit breaker with a switching unit configured to interrupt a circuit; a sensor unit configured to determine the value of a variable that is characteristic of a current flowing in the circuit; and a control unit configured to control the switching unit as a function of the determined value so as to interrupt the circuit; and a self-preservation circuit configured to maintain a switched state of the switching unit after the circuit is interrupted by the switching unit, until such time as a signal from the control unit activates the switching unit to cancel the circuit interruption.

United States patent publication US 2005/0135034 A1 describes a resettable circuit breaker comprising a current monitoring and interrupting circuit with an electrically conductive line that conveys a current. A sensor emits a voltage level as an indication of the magnitude of the current. A comparator compares the voltage level to a reference potential and generates a circuit indication signal. A logic-based interrupter controls the current in the line as a reaction to the circuit indication signal.

United States patent publication U.S. Pat. No. 6,594,129 B1 discloses a semiconductor relay system to supply a lamp load under ON/OFF control by a microcomputer, using a semiconductor relay.

The German patent application publication DE 10 2011 057 002 A1 shows a device for monitoring the operating state of a reverse polarity protection device provided between a voltage source and a load and having a metal-oxide-semiconductor field-effect transistor (MOSFET) switching unit that is capable of being controlled as a reaction to a gate-triggering signal from control means into an ON state of its channel. It is provided therein that means of detecting a voltage drop across the channel are associated with the MOSFET switching unit and that they are configured in such a way that in the event of an unreversed polarity of the voltage source the detection means generate a detection signal corresponding to an activation state of the MOSFET switching unit.

An electronic circuit breaker may have the drawback that it reactivates the line being monitored as soon as the safeguarding condition is no longer met. Another disadvantage may be that the electronic circuit breaker, like an electrical fuse, cannot be reset. Yet another disadvantage is a relatively high quiescent current consumption.

SUMMARY

Various forms of the present disclosure provide a circuit breaker that remains (engages) in the activated state upon being triggered. The present disclosure also reduces the quiescent current consumption as compared to known solutions.

In one form, this is achieved by the subject matter of the independent claims. Advantageous further developments of the present disclosure are specified in the dependent claims, the description and the accompanying drawings.

An electronic circuit breaker according to the present disclosure comprises a shunt resistor, a controllable switching element, a voltage detector and a hold element. The electronic circuit breaker is particularly well-suited for an electrical load in an on-board electrical system of a motor vehicle.

In one form, a 12 V on-board electrical system of a motor vehicle may be involved.

An input of the electronic circuit breaker is connected to an output of the electronic circuit breaker through the shunt resistor and the controllable switching element. The input is connected to an energy storage means or other voltage source; the output may be electrically connected to the load to be protected. In addition, the controllable switching element has a control input. This is also referred to as a gate.

The voltage detector is configured to detect a voltage drop across the shunt resistor and to provide a control signal if the voltage drop across the shunt resistor exceeds a threshold value. A control signal output of the voltage detector is connected to the control input of the controllable switching element. The control signal is set to switch the controllable switching element. The controllable switching element switches off when the threshold value is exceeded. Thus, no voltage in excess of the threshold value is passed on by the electronic circuit breaker. The voltage detector is configured to provide a control signal to switch off the electrical load at the control input of the controllable switching element when the voltage drop exceeds the threshold value.

The hold element is coupled to the voltage detector and is configured to hold the control signal in an OFF state when the controllable switching element is switched to no passage, whereby it has switched off an electrical load connected to the electronic circuit breaker.

The simple circuit structure makes it possible to detect an overcurrent quickly and inexpensively; here the detection is associated with a switching-off.

In one form, the control element may be implemented as a semiconductor element. The semiconductor element may particularly be a power transistor. In one variation, the voltage detector and the hold element are semiconductor components. For example, the electronic circuit breaker is easy to implement on a printed circuit board.

The switchable control element may be provided in the form of a MOSFET, particularly a positive-channel (p-channel or p-ch) MOSFET. Unlike a negative-channel (n-channel) MOSFET, no charge pump is required here and the circuit can be provided with few components and with little or no leakage and/or current consumption.

The voltage detector may be a transistor, particularly a positive-negative-positive (pnp) transistor. The threshold value here may correspond to the base-emitter voltage of the pnp transistor. Thus, the pnp transistor switches when the voltage dropping across the shunt resistor matches the switching threshold of the pnp transistor. Thus, it is possible to efficiently provide threshold value monitoring and a switching process in one electronic component.

The shunt-resistor contact connected to the input of the electronic circuit breaker may be referred to as the input and the additional shunt-resistor contact may be called the output of the shunt resistor—following the direction of current flow. In one form, the emitter of the pnp transistor is coupled to the input of the electronic circuit breaker (corresponds to the shunt-resistor input) and the base is coupled to the output of the shunt resistor.

A first resistor may be arranged between the base of the pnp transistor and the output of the shunt resistor. If the voltage drop across the first resistor is greater than the base-emitter voltage of the pnp transistor, the OFF state of the MOSFET is maintained, and the pnp transistor remains conductive.

The first resistor together with the second resistor serve to maintain the OFF state in order for the pnp transistor to remain conductive.

To protect the power transistor, particularly the gate of the power transistor from transient overvoltages, a first diode is advantageously arranged between the gate and the source of the MOSFET. The first diode may particularly be a Z diode, also referred to as a Zener diode. The forward direction of the first diode is toward the source, i.e. the input of the controllable switching element.

In addition, the hold element has a negative-positive-negative (npn) transistor. The base of the npn transistor may be electrically coupled through a second diode to the collector of the pnp transistor. The forward direction of the diode is toward the base of the npn transistor. The collector of the npn transistor is electrically coupled through a second resistor to the base of the pnp transistor. The emitter of the transistor is electrically coupled to ground. The arrangement of the npn transistor causes the power transistor to lock in the switched off, nonconductive state after activation of the electronic circuit breaker. This way the electronic circuit breaker is triggered when the voltage dropping across the shunt resistor exceeds a threshold value, and then it remains in this state.

In addition, the gate of the power transistor may be electrically coupled to ground via a resistor. In one form, this applies when a p-channel MOSFET is being used. The alternative solution with an n-channel MOSFET additionally uses at least one charge pump and also a driver instead of the resistor given here.

A reset function and, as a supplement or an alternative, activation via an external control signal may be integrated into the electronic circuit breaker. This may be implemented with a second npn transistor in connection with a control device or as an alternative via two (manual or controllable) buttons.

The electronic circuit breaker has a second npn transistor and a control unit. For example, the control unit may be in the form of a microprocessor, a signal processor, a field-programmable gate array (FPGA) or application-specific integrated circuit (ASIC). Here the collector of the second npn transistor is coupled to the base of the (first) npn transistor; the emitter of the second npn transistor is coupled to ground; and the base of the second npn transistor is coupled to the reset output of the control unit. Furthermore, a control output of the control unit is electrically coupled to the base of the (first) npn transistor and a diagnostic input of the control unit is electrically coupled to the collector of the (first) npn transistor. It is advantageous if a third diode is arranged between the control output and the base of the (first) npn transistor, with the forward direction being toward the base of the (first) npn transistor.

The method described here makes it possible to quickly detect the overcurrent possible, based on a shunt current measurement, and to switch off the load via a p-channel MOSFET. In addition to the feature of a melting fuse, as well as a continuously conductive state in normal operation, this circuit also has diagnostic, testing and resetting possibilities.

The electronic circuit breaker can be reset via the reset output following activation or triggering, with the result that it once more becomes conductive. The electronic circuit breaker may be triggered via the control output for testing purposes or due to external control signals, in order not to continue supplying the connected load. For this purpose the control unit may be connected to a higher-level control device via a communication bus. For example, the communication bus may be a standardized communication bus such as an inter-integrated circuit ($I^2C$), local interconnect network (LIN) or controller area network (CAN), among others.

In an alternative variant the electronic circuit breaker may have two buttons that are manually controllable or as an alternative controlled via a higher-level control logic. Here a first button is arranged between the input of the electronic circuit breaker and the base of the (first) npn transistor, and a second button is arranged between the base of the (first) npn transistor and ground. In addition, a third diode may be arranged between the first button and the base of the (first) npn transistor.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1:
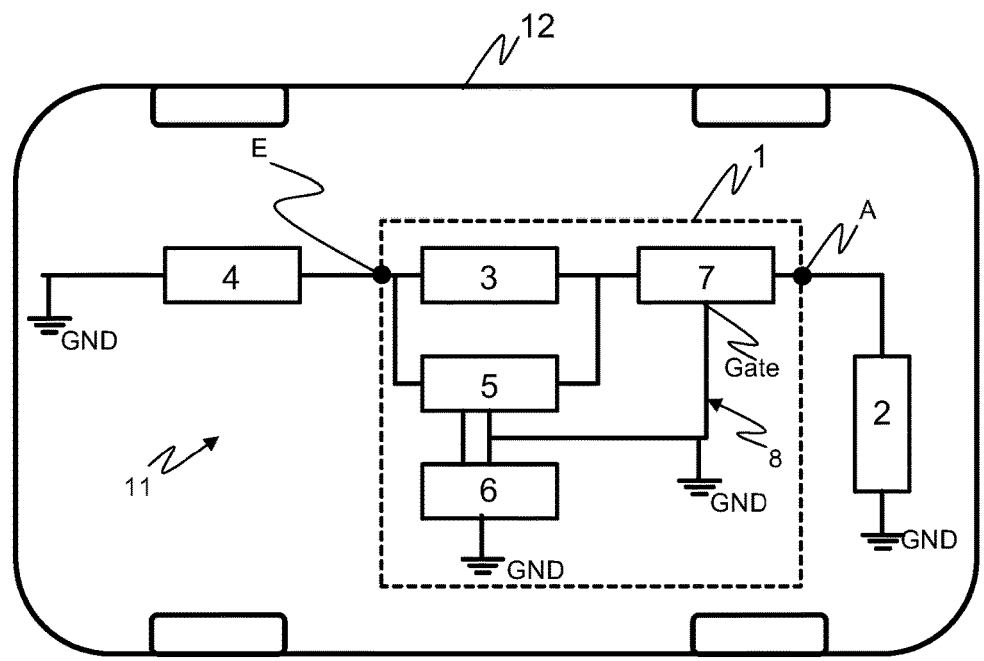
FIG. 1 is a circuit diagram of a first form of an electronic circuit breaker according to the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

An electronic circuit breaker 1 for loads 2 in an on-board electrical system 11 of a motor vehicle 12 is shown in FIG. 1. In its simplest form, the on-board electrical system 11 includes a load 2 supplied by an energy storage device 4 via an electronic circuit breaker 1. This load stands for additional loads 2 and electronic circuit breakers 4, and also current distributors, etc. The electronic circuit breaker 1 includes a shunt resistor 3, a controllable switching unit 7, a voltage detector 5 and a hold element 6. The electronic circuit breaker 1 also has an input E and an output A. The input E is electrically coupled to the energy storage device 4, and the output A is electrically coupled to the electrical load 2. The common ground GND is represented in FIG. 1 by four ground terminals GND. "GND" in figure and specification represent ground. The input E is electrically coupled to the output A through the shunt resistor 3 and the controllable switching element 7. The voltage detector 5 is arranged parallel to the shunt resistor 3. In addition, a control input GATE of the controllable switching element 7 is electrically coupled to the voltage detector 5 and to ground. "GATE" in figure and specification represent the control input of switching element 7. The hold element 6 is connected to the voltage detector 5, to the gate of the controllable switching element 7 and to ground.

In one variant the controllable switching element 7 is a semiconductor switch, particularly in the form of a power transistor.

Figure 2:
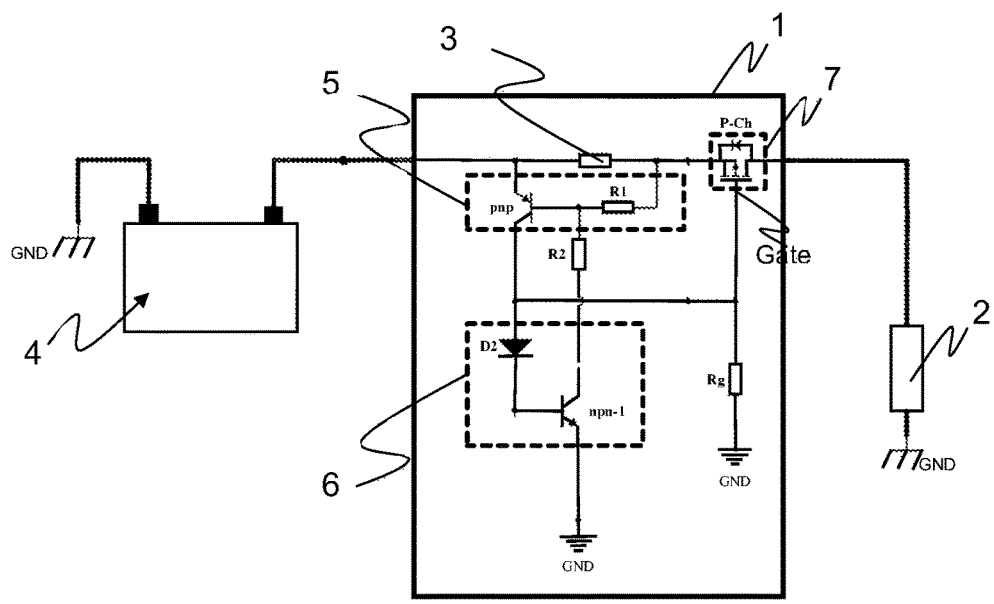
FIG. 2 is a circuit diagram of a second form of an electronic circuit breaker according to the present disclosure.

FIG. 2 shows a second form of the present disclosure, in which the controllable switching element 7 is provided in the form of a MOSFET 7. The MOSFET 7 in this case is also referred to as p-ch, since it is a p-channel MOSFET 7. Here the voltage detector 5 includes a pnp transistor pnp and the hold element 6 includes an npn transistor ("npn-1" represents first npn transistor in figures and specification).

The source of the MOSFET p-ch or controllable switching element 7 is electrically coupled to the shunt resistor 3; the drain of the MOSFET p-ch or controllable switching element 7 is electrically coupled to the output A of the electronic circuit breaker 1. The emitter of the pnp transistor pnp is electrically coupled to the input of the electronic circuit breaker 1 and the base of the pnp transistor pnp is electrically coupled via a first resistor R1 to the source of the MOSFET p-ch or the controllable switching element 7. In the form shown with a p-channel MOSFET, a first diode D1 is arranged between the gate and the source of the MOSFET, which has a forward direction toward the source. The collector of the pnp transistor pnp is connected to the gate of the MOSFET or to the control input of the controllable switching element 7.

In addition, the collector of the pnp transistor pnp is electrically coupled via a second diode D2 to the base of the (first) npn transistor npn-1. The forward direction of the second diode D2 is toward the npn transistor npn-1. The emitter of the npn transistor is connected to ground GND; the collector of the npn transistor npn-1 is connected via a second resistor R2 to the base of the pnp transistor pnp.

The circuit of the electronic circuit breaker 1 comprises a shunt resistor 3 to detect the flowing current; a p-channel MOSFET p-ch as a switching element 7; a pnp transistor pnp as voltage detector 5; and an npn transistor npn-1 as the hold element 6. A primary feature of the present disclosure is formed by the locking cut-off of the p-channel MOSFET p-ch by the pnp transistor pnp when its base emitter threshold voltage is reached. The base and the emitter of the pnp transistor pnp are directly connected to the shunt resistor 3; therefore, the base emitter voltage and the shunt value are decisive for dimensioning the short-circuit current. The locking cut-off is achieved in that the additional npn transistor npn-1 pulls down the base of the pnp transistor pnp in the event of an overcurrent, and its base terminal and also the gate terminal of the p-channel MOSFET are controlled from the collector of the pnp transistor pnp.

Figure 3:
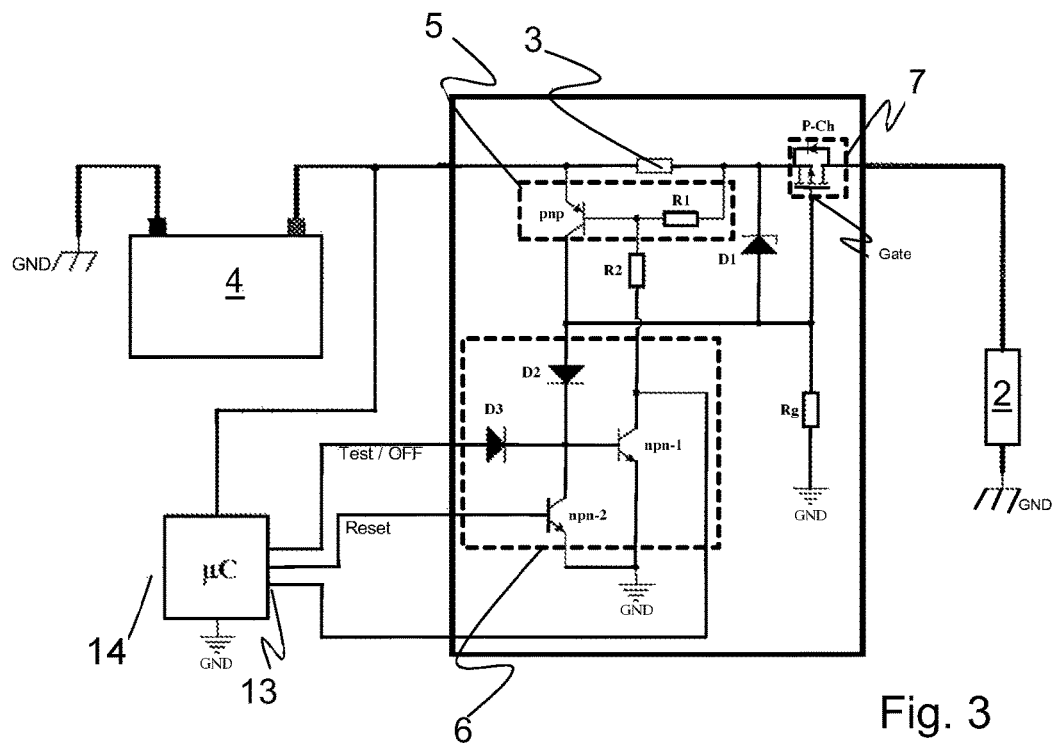
FIG. 3 is a circuit diagram of a third form of an electronic circuit breaker according to the present disclosure.

The third form of an electronic circuit breaker 1 as shown in FIG. 3 differs in particular from the second form by a second npn transistor ("npn-2" represents second npn transistor in figures and specification) for resetting). The control and diagnosis are provided by a control device μC.

Accordingly, the second form shown in FIG. 2 has been expanded by the second npn transistor npn-2 and the control device μC in FIG. 3. The collector of the second npn transistor npn-2 is connected to the base of the first npn transistor npn-1. The emitter of the second npn transistor npn-2 is electrically coupled to the emitter of the first npn transistor npn-1 and to ground GND. The base of the second npn transistor npn-2 is connected to a reset terminal RESET of the control device μC.

A diagnostic input 13 of the control device μC is connected to the collector of the (first) npn transistor npn-1; a TEST or OFF output of the control device μC is electrically coupled through a third diode D3 to the base of the first transistor npn-1 and/or to the collector of the second npn transistor npn-2.

The control device is coupled for voltage supply to the energy storage device 4 and also has a communication bus terminal 14 implemented here in the third form as a LIN bus. In variants of the form shown, the communication bus is implemented as $I^2C$, CAN or any other standard bus type for communication with a higher-level control device.

An optional protective circuit is provided before the diagnostic input. A flank of 12 V to 0 V is applied here as a standard, so that a voltage divider or current limiter can limit the signal level to protect the diagnostic input.

The circuit shown in FIG. 3 comprises a shunt resistor 3 (shunt) to detect the flowing current; a p-channel MOSFET p-ch as a switching element 7; a pnp transistor pnp as voltage detector 5; a first npn transistor npn-1 as a hold element 6; and a second npn transistor npn-2 for resetting purposes. When the battery voltage is applied the electronic circuit breaker 1 is immediately put into the conducting state, since the gate of the p-ch MOSFET 7 is suspended over the resistor Rg to ground GND. The signals of the control device μC are to be presumed to be logic zero (as in the sleep mode). The diode D1 protects the gate of the power transistor 7 in the event of transient overvoltages. Furthermore, this diode D1 is responsible for the quiescent current consumption conditioned by its leakage current. If the consumer 2 draws an overcurrent, then a voltage drops at the shunt resistor 3. If this voltage reaches the base-emitter voltage of the pnp transistor pnp, the transistor becomes conductive. Thereupon, the gate of the power transistor 7 is pulled up to its source potential and the MOSFET 7 begins to block. Since the pnp transistor pnp also supplies the first npn transistor npn-1 through the diode D2, and the npn transistor in turn is connected through the second resistor R2 to the base of the pnp transistor pnp, this has the effect of positive feedback. The pnp transistor pnp thereby remains activated. This is how the locking cut-off of the p-channel MOSFET p-ch/7 is achieved. This state may be detected via the diagnostic line. The level here changes from 'high'—typically 12 V-to 'low'—typically 0 V. In order to reactivate the circuit, an external RESET signal (high level) must be injected. This signal controls the second npn transistor npn-2, which in turn pulls the base of the first npn transistor npn-1 to ground GND. This causes the first npn transistor npn-1 to lose its triggering and the base of the pnp transistor pnp is pulled over the first resistor R1 to its emitter potential. This causes it to lock and the MOSFET p-ch/7 becomes conductive again. An external signal can also be injected via the third diode D3 to test the circuit. The first npn transistor npn-1 is triggered in this way and pulls the base of the pnp transistor pnp to ground GND. The MOSFET p-ch/7 then switches off. This simulates the occurrence of an overcurrent.

The circuit shown is designed for signal levels essentially of 12 V. Of course an expert can adapt the circuit for 24 V or 48 V. In that case, however, an additional gate circuit and, as a supplement or alternative, a driver must be included instead of the resistor Rg.

Figure 4:
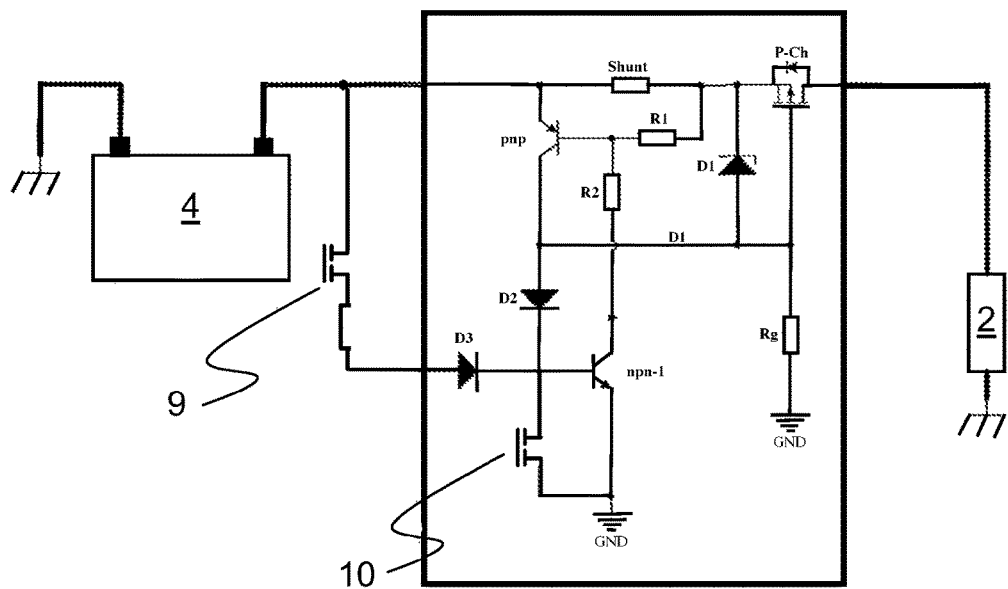
FIG. 4 is a circuit diagram of a fourth form of an electronic circuit breaker according to the present disclosure.

Both the RESET function and a test function of the manual triggering may be realized as an alternative through a respective button. A corresponding fourth form is shown FIG. 4. A first button 9 between the input E of the electronic circuit breaker and the base of the npn transistor npn-1 enables manual triggering. A second button 10 replaces the second npn transistor of the third form to allow the circuit to be reset.

Thus, the fourth form corresponds to the second form with the addition of having a first button 9 between the input of the electronic circuit breaker 1 and the base of the npn transistor npn-1. A resistor and a third diode D3 are arranged between the first button and the base of the npn transistor npn-1 The forward direction of the third diode D3 is toward the npn transistor npn-1.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. An electronic circuit breaker for an electrical load in on-board electrical system of a motor vehicle, the electronic circuit breaker comprising
   a shunt resistor connected at its input side to an input of the electronic circuit breaker;
   a controllable switching element coupled at its input side to an output of the shunt resistor and at its output side to an output of the electronic circuit breaker, the output being connectable to an electrical load, and having a control input;
   a voltage detector to detect a voltage drop across the shunt resistor, the voltage detector being configured to provide to the control input a control signal to switch off the electrical load when the voltage drop exceeds a threshold value;
   a hold element coupled to the voltage detector and configured to maintain the control signal in an off-mode when the controllable switching element has switched off the electrical load, wherein the hold element has a first negative-positive-negative (npn) transistor; and
   a second npn transistor, wherein:
   a collector of the second npn transistor is coupled to a base of the first npn transistor, an emitter of the second npn transistor is coupled to ground, and a base of the second npn transistor is coupled to a reset output of a control device,
   a control output of the control device is coupled through a third diode in a forward direction to the base of the first npn transistor, and
   a diagnostic input of the control device is coupled to a collector of the first npn transistor.

2. The electronic circuit breaker according to claim 1, wherein the controllable switching element is a semiconductor switching element.

3. The electronic circuit breaker according to claim 1, comprising instead of the second npn transistor:
   a first button, with the input of the electronic circuit breaker being coupled through the first button via the third diode in a forward direction to the base of the first npn transistor; and
   a second button, with the base of the first npn transistor being coupled through the second button to ground.

4. The electronic circuit breaker according to claim 1, wherein the voltage detector has a positive-negative-positive (pnp) transistor.

5. The electronic circuit breaker according to claim 2, wherein the controllable switching element is a p-channel metal-oxide-semiconductor field-effect transistor (MOSFET).

6. The electronic circuit breaker according to claim 4, wherein the collector of the pnp transistor is coupled via a second diode to the source of the p-channel MOSFET in the forward direction.

7. The electronic circuit breaker according to claim 5, wherein a gate of the p-channel MOSFET is coupled via a resistor to ground.

8. The electronic circuit breaker according to claim 4, wherein the base of the pnp transistor is coupled via a first resistor to the output of the shunt resistor, the emitter of the pnp transistor is coupled to the input of the shunt resistor, and the collector of the pnp transistor is coupled to the hold element.

9. The electronic circuit breaker according to claim 4, wherein the collector of the pnp transistor, starting from the pnp transistor in the forward direction, is coupled via a second diode to the base of the first npn transistor, the collector of the first npn transistor is coupled via a second resistor to the base of the pnp transistor, and the emitter of the first npn transistor is coupled to ground.

\* \* \* \* \*